(12) United States Patent
Linderman et al.

(10) Patent No.: US 8,860,162 B2
(45) Date of Patent: Oct. 14, 2014

(54) OPTOELECTRONIC DEVICE WITH HEAT SPREADER UNIT

(75) Inventors: Ryan Linderman, Oakland, CA (US); Matthew Dawson, Menlo Park, CA (US); Itai Suez, Hercules, CA (US)

(73) Assignee: Sunpower Corporation, San Jose, CA (US)

( * ) Notice: Subject to any disclaimer, the term of this patent is extended or adjusted under 35 U.S.C. 154(b) by 212 days.

(21) Appl. No.: 13/245,611

(22) Filed: Sep. 26, 2011

(65) Prior Publication Data

US 2012/0012156 A1     Jan. 19, 2012

Related U.S. Application Data

(63) Continuation of application No. 12/577,616, filed on Oct. 12, 2009, now Pat. No. 8,530,990.

(60) Provisional application No. 61/227,024, filed on Jul. 20, 2009.

(51) Int. Cl.
| | | |
|---|---|---|
| *H01L 31/0203* | (2014.01) | |
| *H01L 33/64* | (2010.01) | |
| *H01L 31/02* | (2006.01) | |
| *H01L 31/048* | (2014.01) | |
| *H01L 31/052* | (2014.01) | |

(52) U.S. Cl.
CPC ........ *H01L 33/642* (2013.01); *H01L 31/02008* (2013.01); *H01L 31/048* (2013.01); *Y02E 10/52* (2013.01); *H01L 31/052* (2013.01)
USPC ........... 257/432; 257/433; 257/448; 257/459; 257/466

(58) Field of Classification Search
None
See application file for complete search history.

(56) References Cited

U.S. PATENT DOCUMENTS

| | | |
|---|---|---|
| 4,153,474 A | 5/1979 | Rex |
| 4,323,719 A | 4/1982 | Green |
| 4,373,783 A | 2/1983 | Anderson |
| 4,456,332 A | 6/1984 | Anderson |
| 4,468,848 A | 9/1984 | Anderson et al. |
| 4,468,849 A | 9/1984 | Anderson et al. |
| 4,481,378 A | 11/1984 | Lesk |
| 4,502,200 A | 3/1985 | Anderson et al. |
| 4,640,734 A | 2/1987 | Roberts et al. |
| 4,643,543 A | 2/1987 | Mohn et al. |
| 4,643,544 A | 2/1987 | Loughran |

(Continued)

FOREIGN PATENT DOCUMENTS

| | | |
|---|---|---|
| DE | 10041271 | 3/2002 |
| DE | 202004005198 | 8/2004 |

(Continued)

OTHER PUBLICATIONS

International Search Report and Written Opinion for International Patent Application No. PCT/US2010/040884, mailed Jan. 25, 2011, 8 pgs.

*Primary Examiner* — David E Graybill
(74) *Attorney, Agent, or Firm* — Knobbe, Martens, Olson & Bear LLP

(57) ABSTRACT

A solar module includes a solar cell, a heat spreader layer disposed above the solar cell, and a cell interconnect disposed above the solar cell. From a top-down perspective, the heat spreader layer at least partially surrounds an exposed portion of the cell interconnect.

20 Claims, 13 Drawing Sheets

(56) References Cited

U.S. PATENT DOCUMENTS

| | | | |
|---|---|---|---|
| 4,759,803 A | 7/1988 | Cohen | |
| 5,180,441 A | 1/1993 | Cornwall et al. | |
| 5,248,346 A | 9/1993 | Fraas et al. | |
| 5,298,768 A * | 3/1994 | Okazaki et al. | 257/81 |
| 5,334,496 A | 8/1994 | Pond et al. | |
| 5,344,496 A | 9/1994 | Stern et al. | |
| 5,389,158 A | 2/1995 | Fraas et al. | |
| 5,409,549 A | 4/1995 | Mori | |
| 5,498,297 A | 3/1996 | O'Neill et al. | |
| 5,580,395 A | 12/1996 | Yoshioka et al. | |
| 5,616,185 A | 4/1997 | Kukulka | |
| 5,660,644 A | 8/1997 | Clemens | |
| 5,697,192 A | 12/1997 | Inoue | |
| 5,865,905 A | 2/1999 | Clemens | |
| 5,899,199 A | 5/1999 | Mills | |
| 5,990,415 A | 11/1999 | Green et al. | |
| 6,034,322 A | 3/2000 | Pollard | |
| 6,131,565 A | 10/2000 | Mills | |
| 6,198,171 B1 * | 3/2001 | Huang et al. | 257/787 |
| 6,323,478 B1 | 11/2001 | Fujisaki et al. | |
| 6,359,209 B1 | 3/2002 | Glenn et al. | |
| 6,442,937 B1 | 9/2002 | Stone | |
| 6,531,328 B1 * | 3/2003 | Chen | 438/26 |
| 6,553,729 B1 | 4/2003 | Nath et al. | |
| 6,607,942 B1 * | 8/2003 | Tsao et al. | 438/122 |
| 6,635,507 B1 | 10/2003 | Boutros et al. | |
| 7,183,587 B2 * | 2/2007 | Negley et al. | 257/99 |
| 7,304,326 B2 * | 12/2007 | Suehiro et al. | 257/79 |
| 7,468,485 B1 | 12/2008 | Swanson | |
| 7,554,031 B2 | 6/2009 | Swanson et al. | |
| 7,709,730 B2 | 5/2010 | Johnson et al. | |
| 7,714,341 B2 * | 5/2010 | Chil Keun et al. | 257/98 |
| 7,820,906 B2 | 10/2010 | Johnson et al. | |
| 7,825,327 B2 | 11/2010 | Johnson et al. | |
| 7,906,793 B2 * | 3/2011 | Negley | 257/98 |
| 7,932,461 B2 | 4/2011 | Johnson et al. | |
| 7,952,057 B2 | 5/2011 | Finot et al. | |
| 8,049,150 B2 | 11/2011 | Johnson et al. | |
| 8,125,000 B2 * | 2/2012 | Kim et al. | 257/99 |
| 2004/0074490 A1 | 4/2004 | Mills et al. | |
| 2005/0035444 A1 * | 2/2005 | Huang | 257/706 |
| 2006/0060867 A1 * | 3/2006 | Suehiro | 257/81 |
| 2006/0097385 A1 * | 5/2006 | Negley | 257/722 |
| 2006/0124953 A1 * | 6/2006 | Negley et al. | 257/99 |
| 2006/0170094 A1 * | 8/2006 | Subramanian et al. | 257/706 |
| 2007/0151598 A1 | 7/2007 | De Ceuster et al. | |
| 2007/0257274 A1 | 11/2007 | Martter et al. | |
| 2008/0035198 A1 | 2/2008 | Teppe et al. | |
| 2009/0056699 A1 | 3/2009 | Mills et al. | |
| 2009/0056785 A1 | 3/2009 | Johnson et al. | |
| 2009/0056786 A1 | 3/2009 | Johnson et al. | |
| 2009/0056787 A1 | 3/2009 | Johnson et al. | |
| 2009/0095284 A1 | 4/2009 | Klotz | |
| 2009/0134421 A1 * | 5/2009 | Negley | 257/98 |
| 2009/0139557 A1 | 6/2009 | Rose et al. | |
| 2010/0154788 A1 | 6/2010 | Wells et al. | |
| 2010/0163014 A1 | 7/2010 | Johnson et al. | |
| 2010/0175740 A1 | 7/2010 | Johnson et al. | |
| 2010/0193014 A1 | 8/2010 | Johnson et al. | |
| 2010/0236626 A1 | 9/2010 | Finot et al. | |
| 2010/0294336 A1 | 11/2010 | Johnson et al. | |
| 2010/0319682 A1 | 12/2010 | Klotz | |
| 2011/0186130 A1 | 8/2011 | Finot et al. | |
| 2011/0226310 A1 | 9/2011 | Johnson et al. | |
| 2011/0265871 A1 * | 11/2011 | Lamarche | 136/259 |
| 2012/0012156 A1 * | 1/2012 | Linderman et al. | 136/246 |

FOREIGN PATENT DOCUMENTS

| | | |
|---|---|---|
| GB | 2340993 | 3/2000 |
| JP | 2007184542 | 7/2007 |
| JP | 2007194521 | 8/2007 |
| JP | 2007214247 | 8/2007 |
| KR | 1020070070183 | 7/2007 |
| KR | 1020090014153 | 2/2009 |
| WO | WO9957493 | 11/1999 |
| WO | WO2007096157 | 8/2007 |
| WO | WO2007096158 | 8/2007 |
| WO | WO2008022409 | 2/2008 |
| WO | WO2008153922 | 12/2008 |
| WO | WO2009023063 | 2/2009 |
| WO | WO2009029275 | 3/2009 |
| WO | WO2009029277 | 3/2009 |

* cited by examiner

OPTOELECTRONIC DEVICE WITH HEAT SPREADER UNIT

CROSS REFERENCE TO RELATED APPLICATIONS

This application is a continuation of U.S. patent application Ser. No. 12/577,616, filed Oct. 12, 2009, which claims the benefit of U.S. Provisional Application No. 61/227,024, filed Jul. 20, 2009, the entire contents of which are hereby incorporated by reference herein.

TECHNICAL FIELD

Embodiments of the present invention are in the field of renewable energy and, in particular, optoelectronic devices with heat spreader units.

BACKGROUND

Light-emitting diode (LED) and photovoltaic (PV) devices are two common types of optoelectronic devices. Thermal management and assembly of optoelectronic systems, such as systems including LED and PV devices, may be considered when evaluating such systems for fabrication and deployment. For example, systems of devices with electrical contacts exclusively on the back side of an optoelectronic die (e.g., with an optical interface on front side of the die) is one area ripe for improvements in thermal management and assembly. Challenges for the fabrication and deployment of such systems include a possible need for a low resistance thermal path between the optoelectronic die and a heat sink, as well as a robust electrical isolation of operating voltages. In order to facilitate high volume manufacturing, design concepts and assembly techniques that are based on continuous processing may also be a consideration.

DETAILED DESCRIPTION

Figure 1:
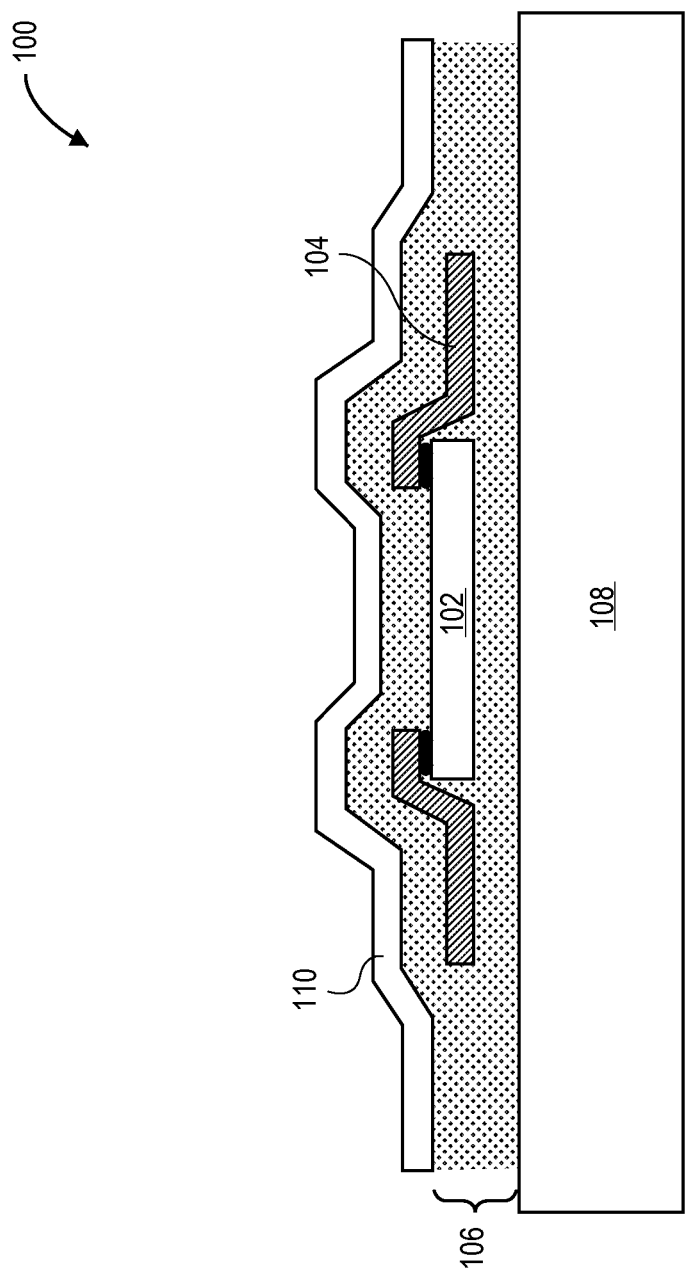
FIG. 1 illustrates a cross-sectional view of a conventional photovoltaic laminate.

Optoelectronic devices with heat spreader units are described herein. In the following description, numerous specific details are set forth, such as specific arrangements of heat spreader units, in order to provide a thorough understanding of the present invention. It will be apparent to one skilled in the art that embodiments of the present invention may be practiced without these specific details. In other instances, well-known fabrication techniques, such as lamination techniques, are not described in detail in order to not unnecessarily obscure embodiments of the present invention. Furthermore, it is to be understood that the various embodiments shown in the Figures are illustrative representations and are not necessarily drawn to scale.

Disclosed herein are optoelectronic devices with heat spreader units. In one embodiment, an optoelectronic device includes a back-contact optoelectronic cell including a plurality of back-contact metallization regions. One or more heat spreader units are disposed above the plurality of back-contact metallization regions. A heat sink is disposed above the one or more heat spreader units. Also disclosed herein are optoelectronic systems. In one embodiment, an optoelectronic system includes a plurality of optoelectronic devices. Each optoelectronic device includes a back-contact optoelectronic cell including a plurality of back-contact metallization regions. Each optoelectronic device also includes one or more heat spreader units disposed above the plurality of back-contact metallization regions. Each optoelectronic device also includes a heat sink disposed above the one or more heat spreader units. The optoelectronic system also includes a pair of cell bus bars, each cell bus bar disposed above a different one of the pair of outer portions of each back-contact optoelectronic cell of each of the plurality of optoelectronic devices.

In accordance with an embodiment of the present invention, a thermal resistance between an optoelectronic die and an external heat sink is reduced, while a more uniform and flat surface across a high heat flux region of the die enclosure or package is provided. The incorporation of a flat surface along the back side of the die enclosure may improve interface and bond quality when attaching the enclosure to the heat sink. In one embodiment, the resulting improved thermal performance allows optoelectronic devices to operate at lower temperatures, thereby increasing light-to-electrical conversion efficiency and reducing degradation and failure of device components. In addition, in one embodiment, high volume continuous manufacturing processes are used to fabricate arrays of optoelectronic die for LED lighting applications and photovoltaic receivers for solar concentrators. By comparison, conventional methods of photovoltaic cell array assembly may rely on batch processing of a string of cells with sequential stacking of components that are laminated together in a final batch process. As discrete components are stacked on top of each other, such as a cell and an interconnect, thickness variations may develop in the laminate. High heat flux regions of the optoelectronic die are typically recessed from the regions of the stacked cell and interconnect, resulting in a poor thermal coupling to the heat sink.

Additionally, in conventional systems, the batch processing operations may have a low manufacturing throughput as, in accordance with an embodiment of the present invention, compared to continuous reel to reel processing. For example, in one embodiment, a flexible substrate is defined and manufactured by continuous roll processing of metal foils, dielectric layers and polymer adhesive coatings. Bare optoelectronic die may then be soldered to the leads of a substrate and encapsulated between a glass cover sheet and a metal heat spreader integrated within the substrate at the region of highest heat flux into the die. In an embodiment, the substrate serves as an electrical interconnect to a potentially unlimited number of die and tightly couples the die thermal flux to a flat, and most proud, exterior surface of the enclosure. In one embodiment, components of optoelectronic systems are manufactured in roll form allowing for high volume continuous processing and subsequent assembly of the optoelectronic systems. In a specific embodiment, the substrate provides a platform for the inclusion of integrated passive devices, such as bypass diodes, in high volume production.

In accordance with an embodiment of the present invention, important challenges for the packaging of optoelectronic systems include the need for a low resistance thermal path between a semiconductor die and a heat sink, as well as a robust electrical isolation of operating voltages. This may especially be true for arrays of high power LED lighting systems and concentrating photovoltaic receivers. In one embodiment, in order to meet high volume manufacturing goals, another challenge is establishing design concepts that are compatible with continuous processes, such as roll feed systems. By contrast, conventional photovoltaic modules may be manufactured by batch processing of a small number of wafers with an initial operation of soldering interconnects between the wafers, providing a serially connected string of cells. The cell string may then be placed onto a thin layer of encapsulant supported by a relatively thick (e.g., 3 millimeters) glass superstrate. An additional layer of encapsulant and protective back sheet may be placed on top of the cell string and the entire stack may then be batch laminated to form a fully encapsulated system.

FIG. 1 illustrates a cross-sectional view of a conventional photovoltaic laminate. Referring to FIG. 1, a conventional photovoltaic laminate 100 includes a photovoltaic cell 102 coupled with a pair of interconnects 104. Photovoltaic cell 102 and the pair of interconnects 104 is disposed in an encapsulant layer 106, above a glass superstrate 108. A back sheet 110 is disposed on encapsulant layer 106.

While the system shown in FIG. 1 may be adequate for some photovoltaic modules, the arrangement may have drawbacks when used to create concentrating photovoltaic (CPV) receivers or high power LED lighting arrays. For example, in one embodiment, such a conventional arrangement provides a non-flat surface on back sheet 110 with a recessed region between interconnects 104 where heat flux is the highest. Additionally, the batch processing of the individual components (e.g., cell arrangement, soldering of interconnects, stacking encapsulant and back sheet) may lower manufacturing throughput.

Figure 2:
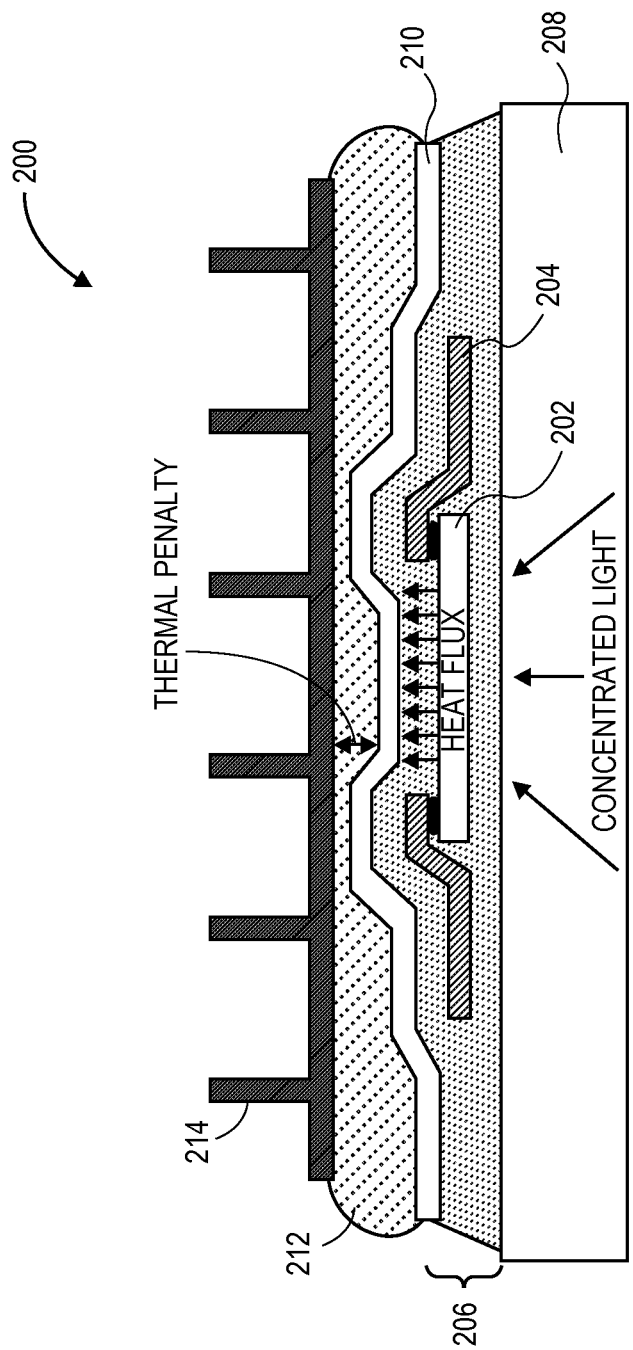
FIG. 2 illustrates a cross-sectional view of a CPV receiver with a conventional photovoltaic laminate arrangement, in accordance with an embodiment of the present invention.

FIG. 2 illustrates a cross-sectional view of a CPV receiver with a conventional photovoltaic laminate arrangement, in accordance with an embodiment of the present invention. Referring to FIG. 2, a CPV receiver 200 with a conventional photovoltaic laminate arrangement includes a photovoltaic cell 202 coupled with a pair of interconnects 204. Photovoltaic cell 202 and the pair of interconnects 204 is disposed in an encapsulant layer 206, above a glass superstrate 208. A heat sink 214 is coupled with a back sheet 210 by an adhesive layer 212.

Referring again to FIG. 2, the overlap of photovoltaic cell 202 and the pair of interconnects 204 creates an increased gap between the high heat flux region on photovoltaic cell 202 and heat sink 214. In one embodiment, a thermal penalty results from backfilling this region with a relatively low thermal conductivity polymer adhesive 212. The cell-to-heat sink thermal resistance for photovoltaic cell 202 and heat sink 214 is dominated by the thermal penalty may typically represents over 50% of the total cell-to-ambient thermal resistance for a conventional cell laminate system.

In accordance with an embodiment of the present invention, the thermal penalty described in association with FIG. 2 is mitigated or eliminated. In an embodiment, a more uniform and flat surface is provided across a high heat flux region of a die or cell enclosure, which may improve bond quality to a heat sink. The increased thermal performance may allow optoelectronic devices to operate at lower temperatures, thereby increasing light-to-electrical conversion efficiency and reducing degradation and failure of components. In addition, in one embodiment, high volume continuous manufacturing processes is used to fabricate nearly unlimited linear arrays of devices, including passive elements such as diodes, for LED lighting applications and photovoltaic receivers for solar concentrators. In an embodiment, a flexible substrate is manufactured by continuous roll processing of metal foils, dielectric layers and polymer adhesive coatings to define a substrate with bond pads for optoelectronic die and passive components, as well as an integrated heat spreader. In one embodiment, thin high voltage dielectric coatings and adhesive layers are included to facilitate lamination to a glass superstrate and are also processed into the substrate in roll form.

Figure 3:
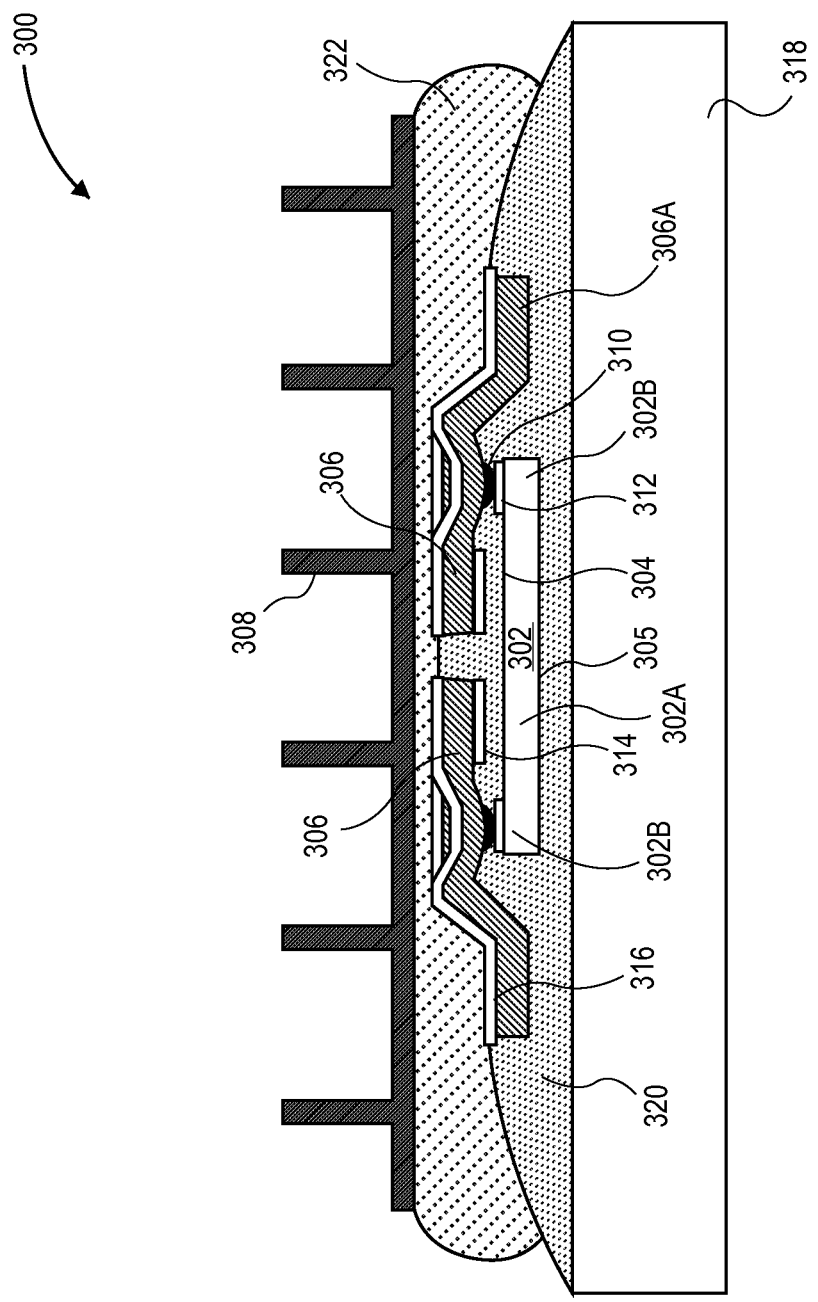
FIG. 3 illustrates a cross-section of an optoelectronic device with a heat spreader unit, in accordance with an embodiment of the present invention.

In an aspect of the present invention, optoelectronic devices with heat spreader units are provided where one or more heat spreader units include a pair of cell interconnects. FIG. 3 illustrates a cross-section of an optoelectronic device with a heat spreader unit, in accordance with an embodiment of the present invention.

Referring to FIG. 3, an optoelectronic device 300 includes a back-contact optoelectronic cell 302. In accordance with an embodiment of the present invention, back-contact optoelectronic cell 302 includes a plurality of back-contact metallization regions on the upper surface 304 of optoelectronic cell 302. Optoelectronic device 300 also includes one or more heat spreader units 306 disposed above the plurality of back-contact metallization regions. A heat sink 308 is disposed above the one or more heat spreader units 306. In accordance with an embodiment of the present invention, the one or more heat spreader units 306 is part of a pair of cell interconnects, as depicted in FIG. 3. In one embodiment, each of the pair of cell interconnects is coupled with the plurality of back-contact metallization regions by one of a pair of bond pads 310, as is also depicted in FIG. 3.

Referring again to FIG. 3, in accordance with an embodiment of the present invention, back-contact optoelectronic cell 302 includes an inner portion 302A and a pair of outer portions 302B, where each of the pair of bond pads 310 is coupled with the back-contact metallization regions by one of a pair of cell bus bars 312. In one embodiment, each cell bus bar 312 is disposed above a different one of the pair of outer portions 302B of back-contact optoelectronic cell 302, and a portion of each of the pair of cell interconnects 306 is disposed over, but not in contact with, the inner portion 302A of back-contact optoelectronic cell 302, as depicted in FIG. 3.

Referring again to FIG. 3, in accordance with an embodiment of the present invention, the portion of each of the pair of cell interconnects 306 disposed over the inner portion 302A of back-contact optoelectronic cell 302 includes a dielectric layer 314 disposed between cell interconnect 306 and the inner portion 302A of back-contact optoelectronic cell 302. In one embodiments, dielectric layer 314 is not in direct contact with the inner portion 302A of back-contact optoelectronic cell 302, as is depicted in FIG. 3.

Referring again to FIG. 3, in accordance with an embodiment of the present invention, each of the pair of cell interconnects 306 includes an extension portion 306A that extends outside the perimeter of back-contact optoelectronic cell 302. In one embodiment, each extension portion 306A includes a second dielectric layer 316, as is depicted in FIG. 3. In an embodiment, back-contact optoelectronic cell 302 is disposed above a superstrate 318, superstrate 318 proximate to a surface 305 of back-contact optoelectronic cell 302 opposite the surface 304 of back-contact optoelectronic cell 302 proximate to the one or more heat spreader units 306. In an embodiment, back-contact optoelectronic cell 302 is coupled with superstrate 318 by an encapsulant material 320, and heat sink 308 is coupled with the one or more heat spreader units 306 by a thermal adhesive material 322, as depicted in FIG. 3.

In accordance with an embodiment of the present invention, a benefit of the arrangement described in association with FIG. 3 comes from the dual purpose heat spreader and cell interconnect 306 which reduces the thermal resistance of the interface between back-contact optoelectronic cell 302 and heat sink 308, while providing a low electrical resistance cell interconnect 306. In an embodiment, in order to provide a high level of heat spreading, the cell interconnect 306 is expanded from both edges of back-contact optoelectronic cell 302 to the center of back-contact optoelectronic cell 302 with a small gap between to provide electrical isolation between opposing interconnects 306. In one embodiment, expanding the interconnect 306 to the center of back-contact optoelectronic cell 302 aids in coupling the heat generated directly from the illuminated portion of back-contact optoelectronic cell 302 to the heat spreader units 306 and provides a low electrical resistance for back-contact optoelectronic cell 302 current generated by illumination. In an embodiment, the outer width of the interconnect and heat spreader unit 306 that is beyond the cell edges (e.g., region 306A) is determined based on system geometry constraints and the thermal efficiency of the heat spreader, which is primarily a function of interconnect thickness, thermal conductivity, and distance from heat source to spreader edges. For example, in a specific embodiment, for very thin interconnect layers the thermal efficiency of the spreader drops relatively rapidly and thus little thermal benefit comes from extending far beyond the cell edges. In a particular embodiment, in order to better couple the heat generated from back-contact optoelectronic cell 302 into the heat spreader unit 306, the dielectric layer thickness is also be minimized since dielectric materials typically have a thermal conductivity much lower than a heat spreader material.

In accordance with an embodiment of the present invention, the arrangement described in FIG. 3 also enables the outer surface of back-contact optoelectronic cell 302 enclosure to be flat, providing a uniform surface for bonding heat sink 308 with an adhesive or other bonding material. In one embodiment, from a manufacturing perspective, the use of a single metal layer to provide both heat spreading and electrical interconnection, e.g., feature 306 of FIG. 3, reduces the manufacturing operations and facilitates continuous processes.

Figure 4:
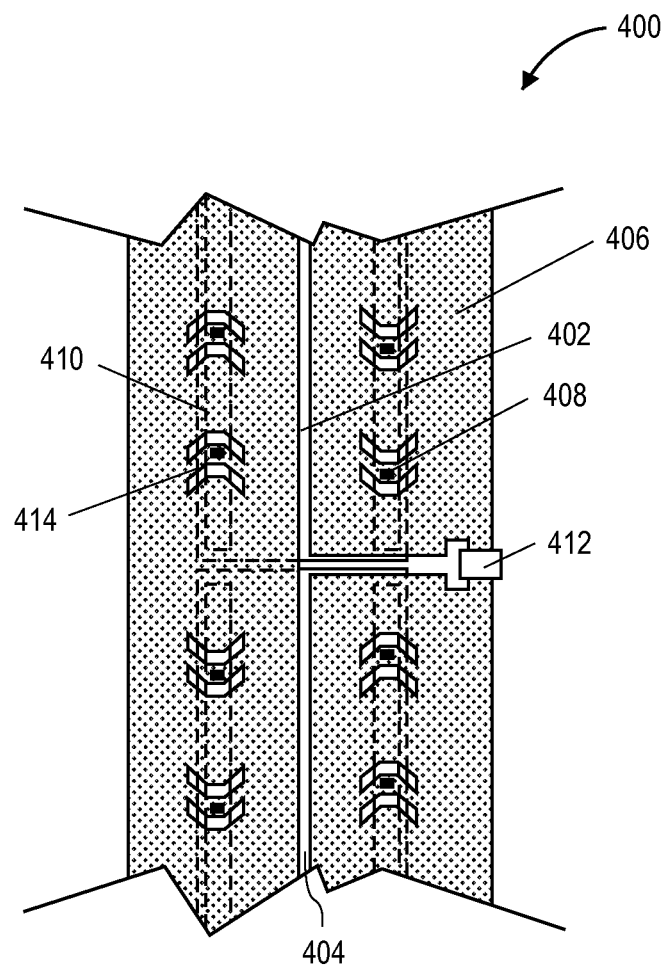
FIG. 4 illustrates a top-down view of an optoelectronic device with a heat spreader unit, in accordance with an embodiment of the present invention.

In an aspect of the present invention, devices such as the device described in association with FIG. 3, is includes as a substrate with a plurality of optoelectronic die and bonded bypass diodes. FIG. 4 illustrates a top-down view of an optoelectronic device with a heat spreader unit, in accordance with an embodiment of the present invention.

Referring to FIG. 4, a system 400 includes two (or more) photovoltaic cells 402 and 404. A heat spreader unit and interconnect combination feature 406 is disposed above photovoltaic cells 402 and 404. In a particular embodiment, photovoltaic cells 402 and 404 are serially connected. Also depicted are a cell bond pad 408, a cell bus bar 410, and a bypass diode 412. In accordance with an embodiment of the present invention, the electrical connection between heat spreader unit and interconnect combination feature 406 and cell bus bar 410 is made at cell bond pad(s) 408, utilizing a solder joint or other bonding technique. In an embodiment, stress relief features 414 are disposed near cell bond pads 408 to allow motion of the contact relative to the heat spreader unit and interconnect combination feature 406, in order to create an electrical contact to photovoltaic cells 402 and/or 404, as described above in association with FIG. 3. In one embodiment, stress relief features 414 are oriented so as to minimize electrical resistance for current flowing between photovoltaic cells 402 and 404 by providing a shorter path and no turn angles greater than approximately 45 degrees. It is to be understood, however, that other stress relief designs could also be integrated. Thus, in an embodiment, at least one cell interconnect of an optoelectronic system includes one or more stress relief features.

In an aspect of the present invention, fabrication of a substrate is accomplished by continuous roll processing to build-in features at high volume and low-cost or by working with individual connectors with the required dielectrics clad to each surface. Many different operation sequences may be contemplated to create either the continuous roll or individual connector elements. In an embodiment, a metal layer used to define a spreader and interconnect combination feature is manufactured by stamping operations in order to punch out material to create stress relief features and to down set the contact pads for enhanced interface with a cell. In one embodiment, narrow tie-bars are used to hold connector strips together and are punched out at later stages in the fabrication of the substrate, or alternatively the substrate is made from individual connector pieces. In one embodiment, the solder or other bonding agent used to bond the spreader and interconnect combination feature to the cells at the bond pads is processed onto the connectors during the processing of the roll or individual connector pieces.

Figure 5:
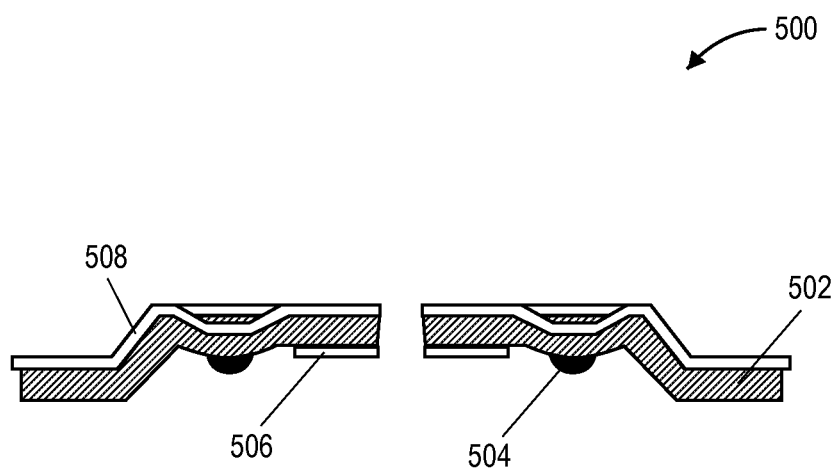
FIG. 5 illustrates a cross-sectional view of a substrate prior to bonding with cells and a bypass diode, in accordance with an embodiment of the present invention.

FIG. 5 illustrates a cross-sectional view of a substrate prior to bonding with cells and a bypass diode, in accordance with an embodiment of the present invention. Referring to FIG. 5, a portion of a substrate for an optoelectronic device 500, or a plurality of devices, includes a heat spreader and cell interconnect combination feature 502, a cell bond pad 504, a cell dielectric 506, and a heat sink dielectric 508.

In conjunction with FIG. 5, it is to be understood that an optional carrier foil may be used to handle the substrate in roll form and can also be introduced to the heat sink dielectric surface or the lower cell dielectric surface. Additionally, an adhesive layer may be present on the surface of the dielectric layers, in order to facilitate bonding to the cell or encapsulant layers of the cell enclosure. A similar substrate could be used for large arrays of high power LEDs for lighting applications.

In accordance with an embodiment of the present invention, a flexible substrate in roll or strip form is next fed into a die bonder to attach bypass diodes and cells continuously at high volume to create cell strings of any desired length. In one embodiment, after die have been bonded the string of interconnected devices, the substrate can be directly transferred to a lamination operation in order to attach a glass superstrate.

Thus, in accordance with an embodiment of the present invention, an optoelectronic system may be fabricated. In an embodiment, the optoelectronic system includes a plurality of optoelectronic devices, such as the device described in association with FIG. 3. Each optoelectronic device includes a back-contact optoelectronic cell including a pair of outer portions, an inner portion, and a plurality of back-contact metallization regions disposed on the inner portion. One or more heat spreader units is disposed above the plurality of back-contact metallization regions. A heat sink is disposed above the one or more heat spreader units. The optoelectronic system also includes a pair of cell bus bars, each cell bus bar disposed above a different one of the pair of outer portions of each back-contact optoelectronic cell of each of the plurality of optoelectronic devices.

In an embodiment, the one or more heat spreader units of each back-contact optoelectronic cell includes a pair of cell interconnects, each of the pair of cell interconnects coupled with the plurality of back-contact metallization regions by one of a pair of bond pads. In one embodiment, each of the pair of bond pads of each back-contact optoelectronic cell is coupled with the back-contact metallization regions by one of the pair of cell bus bars, and a portion of each of the pair of cell interconnects of each back-contact optoelectronic cell is disposed over, but not in contact with, the inner portion of the back-contact optoelectronic cell. In one embodiment, for each back-contact optoelectronic cell, the portion of each of the pair of cell interconnects disposed over the inner portion of the back-contact optoelectronic cell includes a dielectric layer disposed between the cell interconnect and the inner portion of the back-contact optoelectronic cell, but not in contact with the inner portion of the back-contact optoelectronic cell. In a particular embodiment, the dielectric layer is not in direct contact with the inner portion of the back-contact optoelectronic cell.

In an embodiment, for each back-contact optoelectronic cell, each of the pair of cell interconnects includes an extension portion that extends outside the perimeter of the back-contact optoelectronic cell, and each extension portion includes a second dielectric layer. In one embodiment, for each back-contact optoelectronic cell, the back-contact optoelectronic cell is disposed above a superstrate, the superstrate proximate to a surface of the back-contact optoelectronic cell opposite the surface of the back-contact optoelectronic cell proximate to the one or more heat spreader units, the back-contact optoelectronic cell is coupled with the superstrate by an encapsulant material, and the heat sink is coupled with the one or more heat spreader units by a thermal adhesive material.

Figure 6:
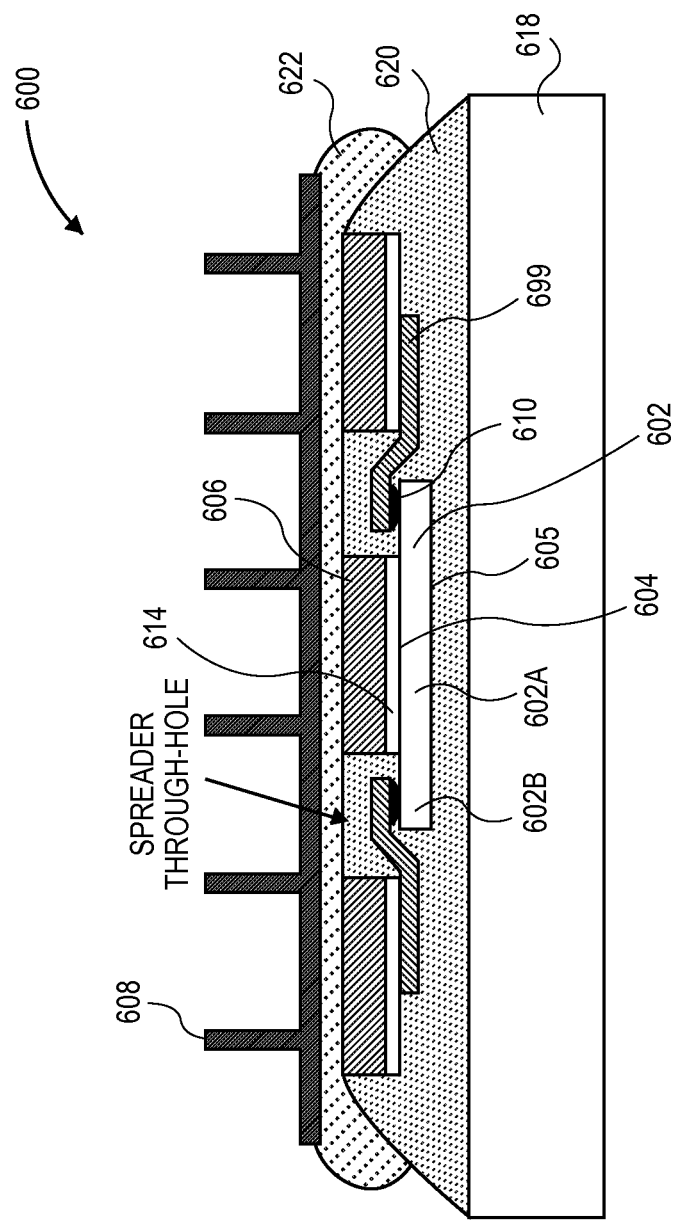
FIG. 6 illustrates a cross-section of an optoelectronic device with a heat spreader unit, in accordance with an embodiment of the present invention.

In an aspect of the present invention, optoelectronic devices with heat spreader units are provided where one or more heat spreader units is electrically isolated from a plurality of back-contact metallization regions. FIG. 6 illustrates a cross-section of an optoelectronic device with a heat spreader unit, in accordance with an embodiment of the present invention.

Referring to FIG. 6, an optoelectronic device 600 includes a back-contact optoelectronic cell 602. In accordance with an embodiment of the present invention, back-contact optoelectronic cell 602 includes a plurality of back-contact metallization regions on the upper surface 604 of optoelectronic cell 602. Optoelectronic device 600 also includes one or more heat spreader units 606 disposed above the plurality of back-contact metallization regions. A heat sink 608 is disposed above the one or more heat spreader units 606. In accordance with an embodiment of the present invention, the one or more heat spreader units 606 is electrically isolated from the plurality of back-contact metallization regions, as depicted in FIG. 6 through the use of dielectric layer 614. In one embodiment, a pair of cell interconnects 699 is coupled with the plurality of back-contact metallization regions by one of a pair of bond pads 610, as depicted in FIG. 6. In an embodiment, each of the pair of bond pads 610 is coupled with the back-contact metallization regions by one of a pair of cell bus bars (not shown).

Referring again to FIG. 6, in accordance with an embodiment of the present invention, back-contact optoelectronic cell 602 includes an inner portion 602A and a pair of outer portions 602B, and the one or more heat spreader units 606 is disposed over the inner portion 602A of back-contact optoelectronic cell 602. In one embodiment, back-contact optoelectronic cell 602 is disposed above a superstrate 618, superstrate 618 proximate to a surface 605 of back-contact optoelectronic cell 602 opposite the surface 604 of back-contact optoelectronic cell 602 proximate to the one or more heat spreader units 606, as depicted in FIG. 6. In an embodiment, back-contact optoelectronic cell 602 is coupled with superstrate 618 by an encapsulant material 620, and heat sink 608 is coupled with the one or more heat spreader units 606 by a thermal adhesive material 622. In accordance with an embodiment of the present invention, a dielectric layer 614 is disposed between the one or more heat spreader units 606 and back-contact optoelectronic cell 602, as is depicted in FIG. 6.

In accordance with an embodiment of the present invention, a benefit of the arrangement described in association with FIG. 6 comes from the close thermal coupling of back-contact optoelectronic cell 602 to heat spreader 606 and heat sink 608. In an embodiment, this arrangement is made possible by the inclusion of through holes in the spreader and dielectric layer that accommodate the cell interconnects. As such, a portion of the cell interconnect, which can be considered as a tab of the cell interconnect, is exposed through the heat spreader layer and is at least partially surrounded by the part of the heat spreader layer around the through hole, and in the present embodiment, the tab of the cell interconnect is completely surrounded by the part of the heat spreader layer around the through hole. In one embodiment, heat spreader 606 is composed of a metal layer with significantly higher thermal conductivity than adhesives and encapsulant materials and further reduces the thermal resistance between back-contact optoelectronic cell 602 and heat sink 608.

Figure 7:
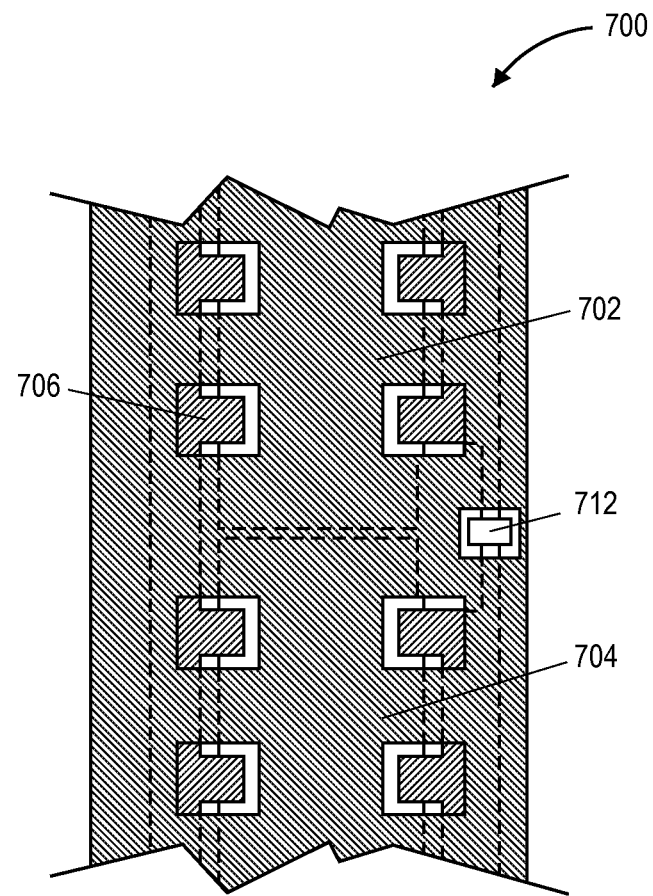
FIG. 7 illustrates a top-down view of an optoelectronic device with a heat spreader unit, in accordance with an embodiment of the present invention.

In an aspect of the present invention, the arrangement of FIG. 6 enables the outer surface of the enclosure of back-contact optoelectronic cell 602 to be flat, providing a uniform surface for bonding a heat sink with an adhesive or other bonding material. FIG. 7 illustrates a top-down view of an optoelectronic device with a heat spreader unit, in accordance with an embodiment of the present invention.

Referring to FIG. 7, a system 700 includes two (or more) photovoltaic cells 702 and 704. A cell interconnect 706 is disposed above photovoltaic cells 702 and 704. In a particular embodiment, photovoltaic cells 702 and 704 are serially connected. Also depicted is a bypass diode 712. In accordance with an embodiment of the present invention, at least one cell interconnect of the optoelectronic system includes one or more stress relief features.

In accordance with an embodiment of the present invention, fabrication of a substrate is accomplished via continuous roll processing to build in features at high volume and low-cost. In one embodiment, the process begins by applying a dielectric coating to a continuous strip of metal used to define a heat spreader. After the dielectric is coated, through holes are punched into the spreader to allow space for cell interconnects and passive components such as the bypass diode. An additional thin adhesive layer, e.g. EVA, can also be applied to the dielectric surface to facilitate bonding to the cell and interconnect layer. In an embodiment, the interconnect layer is then added to the roll containing the dielectric and heat spreader to define a bi-metallic system with isolating dielectric layer that is ready to bond cells and other components. The interconnect layer may be processed with pre-plated soldering pads or other features to allow soldering or bonding of semiconductor die. In alternative embodiments of the substrate fabrication process, the substrate may be defined by building up the bi-metallic layers from both sides of dielectric core or by building up from the lower interconnect layer. In an embodiment, a possible advantage of such fabrication processes over conventional techniques is the high volume roll processing of the interconnects, heat spreader and dielectric into a single component rather than integrating these components individually into a batch process.

Figure 8:
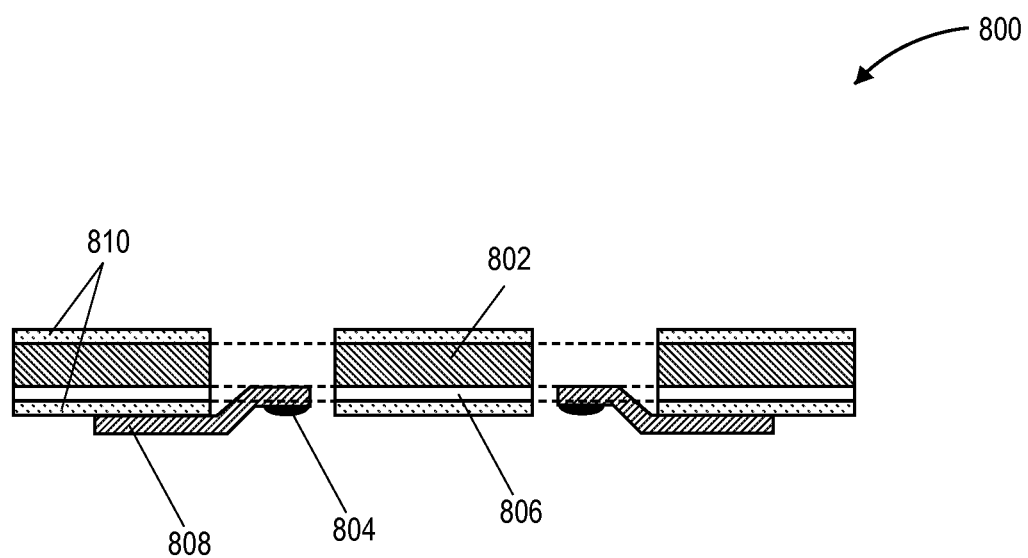
FIG. 8 illustrates a cross-sectional view of a substrate prior to bonding with cells and a bypass diode, in accordance with an embodiment of the present invention.

FIG. 8 illustrates a cross-sectional view of a substrate prior to bonding with cells and a bypass diode, in accordance with an embodiment of the present invention. Referring to FIG. 8, a portion of a substrate for an optoelectronic device 800, or a plurality of devices, includes a heat spreader 802, a cell bond pad 804, a dielectric layer 806, a pair of cell interconnects 808, and an adhesive layer 810. In accordance with an embodiment of the present invention, heat spreader 802 is electrically isolated from the pair of cell interconnects 808, as is depicted in FIG. 8. In accordance with an alternative embodiment of the present invention, dielectric layer 806 and adhesive layer, and possibly an encapsulant layer, are actually a single material layer with multiple functionalities.

Figure 9:
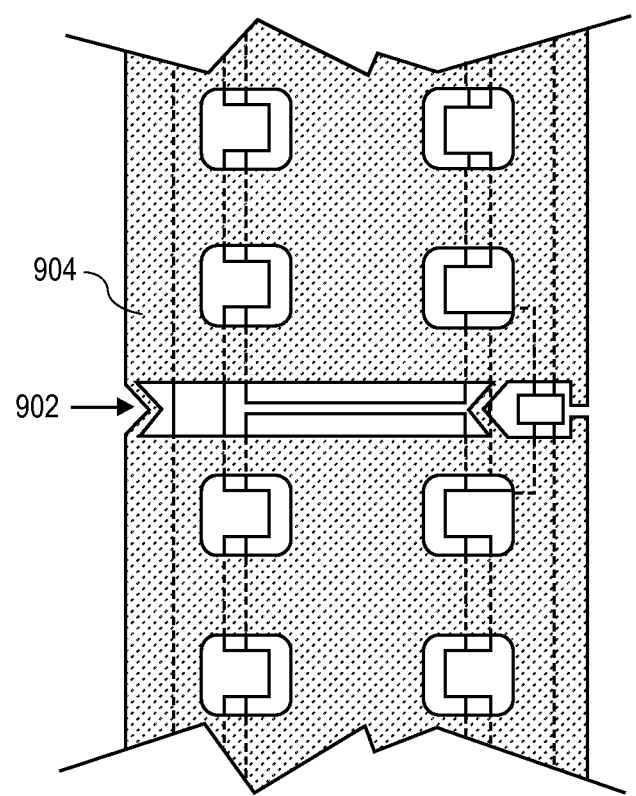
FIG. 9 illustrates a top-down view representing an example of a stress relief feature in a heat spreader layer, in accordance with an embodiment of the present invention.

In conjunction with the description of FIG. 8, a flexible substrate in roll form may then be fed into a die bonder to attach bypass diodes and cells continuously at high volume to create cell strings of any desired length. In an embodiment, after die have been bonded, the string of interconnected devices can be directly transferred to a lamination operation to attach a glass superstrate. It is noted that in an embodiment, stress relief features can be added to the heat spreader and cell interconnect layers to reduce stresses that develop from high temperature bonding and laminating operations. An example of a stress relief feature 902 in a heat spreader layer 904 is shown in FIG. 9, in accordance with an embodiment of the present invention. In an embodiment, temporary structural tie-bars can also be integrated into the interconnect and heat spreader layers that are punched out in a later stage of processing.

Thus, in accordance with an embodiment of the present invention, an optoelectronic system may be fabricated. In an embodiment, the optoelectronic system includes a plurality of optoelectronic devices, such as the device described in association with FIG. 6. Each optoelectronic device includes a back-contact optoelectronic cell including a pair of outer portions, an inner portion, and a plurality of back-contact metallization regions disposed on the inner portion. One or more heat spreader units is disposed above the plurality of back-contact metallization regions. A heat sink is disposed above the one or more heat spreader units. The optoelectronic system also includes a pair of cell bus bars, each cell bus bar disposed above a different one of the pair of outer portions of each back-contact optoelectronic cell of each of the plurality of optoelectronic devices.

In an embodiment, for each back-contact optoelectronic cell, the one or more heat spreader units is electrically isolated from the plurality of back-contact metallization regions. In one embodiment, for each back-contact optoelectronic cell, the back-contact optoelectronic cell includes an inner portion and a pair of outer portions, and the one or more heat spreader units is disposed over the inner portion of the back-contact optoelectronic cell. In one embodiment, for each back-contact optoelectronic cell, the back-contact optoelectronic cell is disposed above a superstrate, the superstrate proximate to a surface of the back-contact optoelectronic cell opposite the surface of the back-contact optoelectronic cell proximate to the one or more heat spreader units, the back-contact optoelectronic cell is coupled with the superstrate by an encapsulant material, and the heat sink is coupled with the one or more heat spreader units by a thermal adhesive material.

Figure 10:
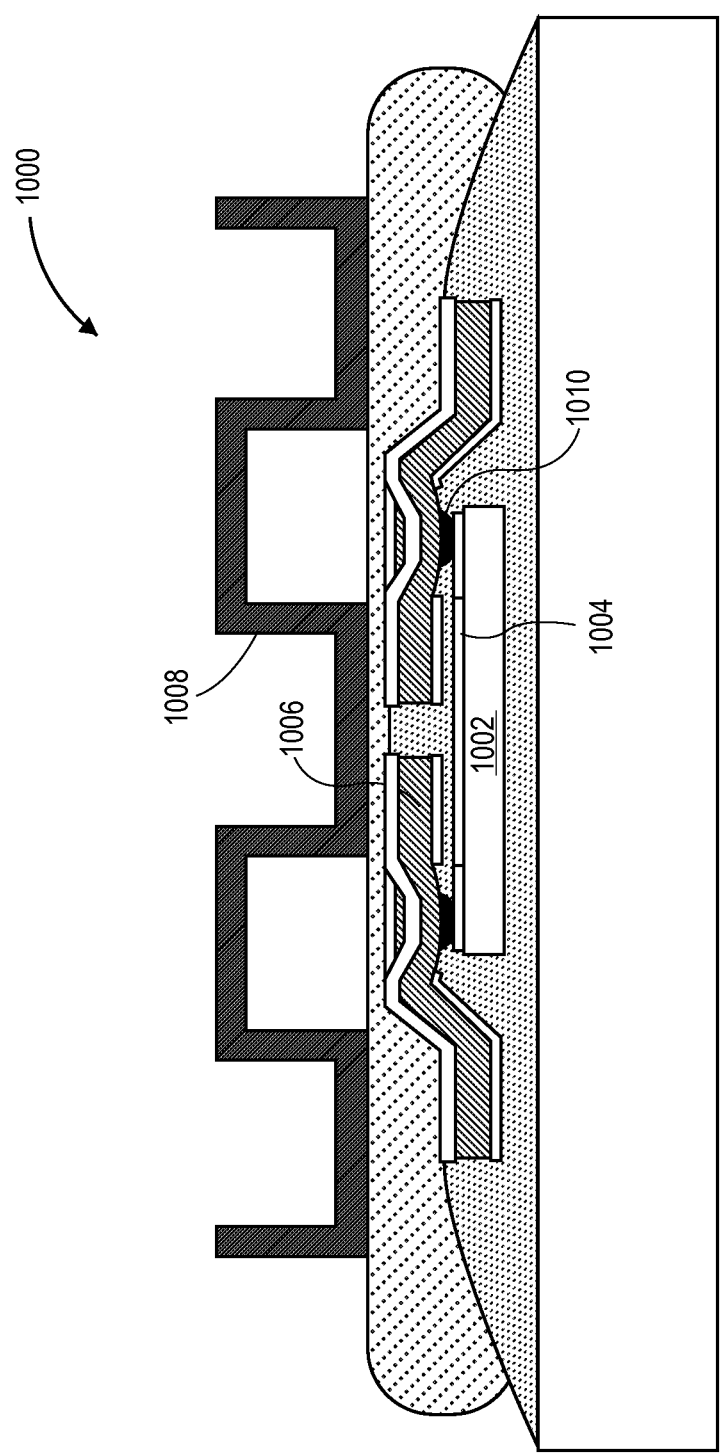
FIG. 10 illustrates a cross-section of an optoelectronic device with a heat spreader unit, in accordance with an embodiment of the present invention.

In another aspect of the present invention, different configuration of a heat sink may be contemplated. FIG. 10 illustrates a cross-section of an optoelectronic device with a heat spreader unit, in accordance with an embodiment of the present invention.

Referring to FIG. 10, an optoelectronic device 1000 includes a back-contact optoelectronic cell 1002. In accordance with an embodiment of the present invention, back-contact optoelectronic cell 1002 includes a plurality of back-contact metallization regions on the upper surface 1004 of optoelectronic cell 1002. Optoelectronic device 1000 also includes one or more heat spreader units 1006 disposed above the plurality of back-contact metallization regions. A folded fin heat sink 1008 is disposed above the one or more heat spreader units 1006. In accordance with an embodiment of the present invention, the one or more heat spreader units 1006 is part of a pair of cell interconnects, as depicted in FIG. 10. In one embodiment, each of the pair of cell interconnects is coupled with the plurality of back-contact metallization regions by one of a pair of bond pads 1010, as is also depicted in FIG. 10.

Figure 11:
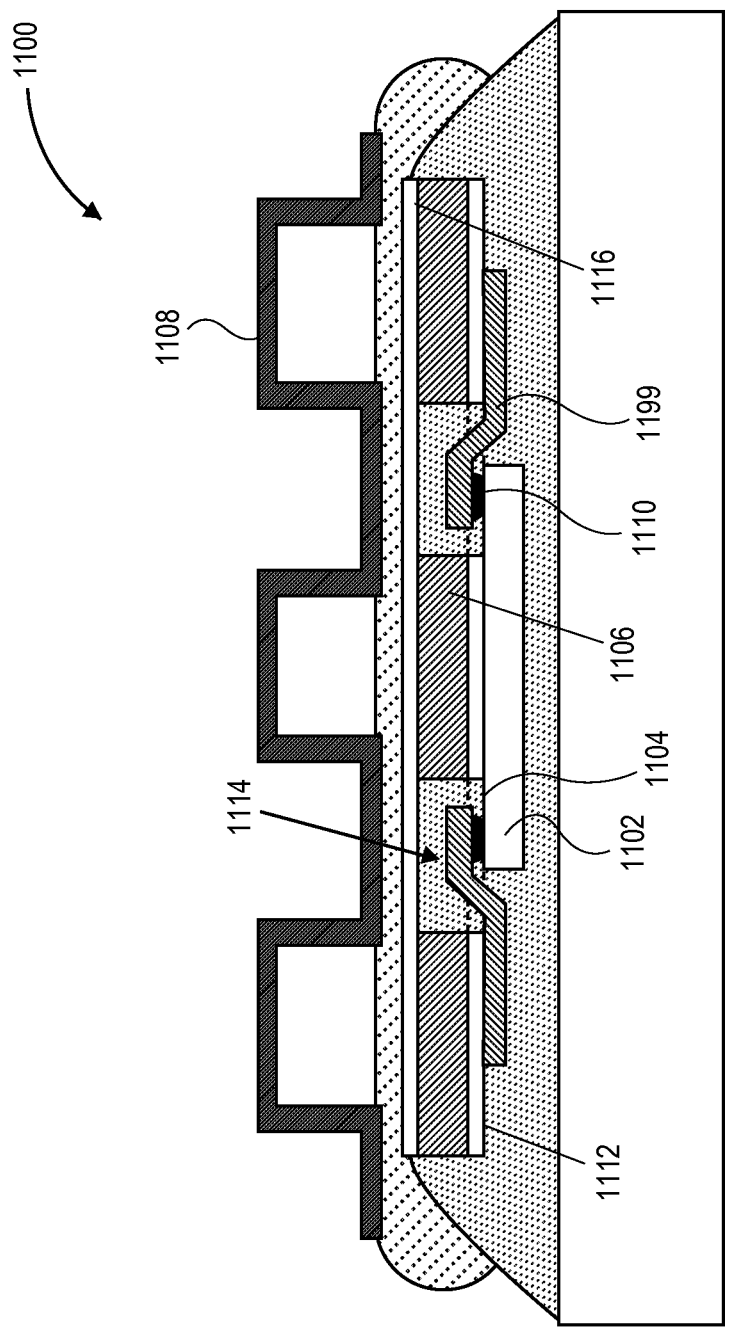
FIG. 11 illustrates a cross-section of an optoelectronic device with a heat spreader unit, in accordance with an embodiment of the present invention.

FIG. 11 illustrates a cross-section of an optoelectronic device with a heat spreader unit, in accordance with an embodiment of the present invention. Referring to FIG. 11, an optoelectronic device 1100 includes a back-contact optoelectronic cell 1102. In accordance with an embodiment of the present invention, back-contact optoelectronic cell 1102 includes a plurality of back-contact metallization regions on the upper surface 1104 of optoelectronic cell 1102. Optoelectronic device 1100 also includes one or more heat spreader units 1106 disposed above the plurality of back-contact metallization regions. A folded fin heat sink 1108 is disposed above the one or more heat spreader units 1106. In accordance with an embodiment of the present invention, the one or more heat spreader units 1106 is electrically isolated from the plurality of back-contact metallization regions, as depicted in FIG. 1. In one embodiment, a pair of cell interconnects 1199 is coupled with the plurality of back-contact metallization regions by one of a pair of bond pads 1110, as depicted in FIG. 11. In an embodiment, each of the pair of bond pads 1110 is coupled with the back-contact metallization regions by one of a pair of cell bus bars (not shown). In an embodiment, optoelectronic device 1100 includes a cell dielectric layer 1112 and a spreader through-hole 1114. In an embodiment, optoelectronic device 1100 includes a heat sink dielectric layer 1116. In one embodiment, heat sink dielectric layer 1116 adds additional insulation protection and potentially a "cap"

for spreader through-hole 1114 if added after the one or more heat spreader units 1106 and spreader through-hole 1114 are punched.

In an aspect of the present invention, multiple levels of heat spreader units may be included above a cell. For example, FIG. 12 illustrates a cross-section of an optoelectronic device with a heat spreader unit, in accordance with an embodiment of the present invention.

Figure 12:
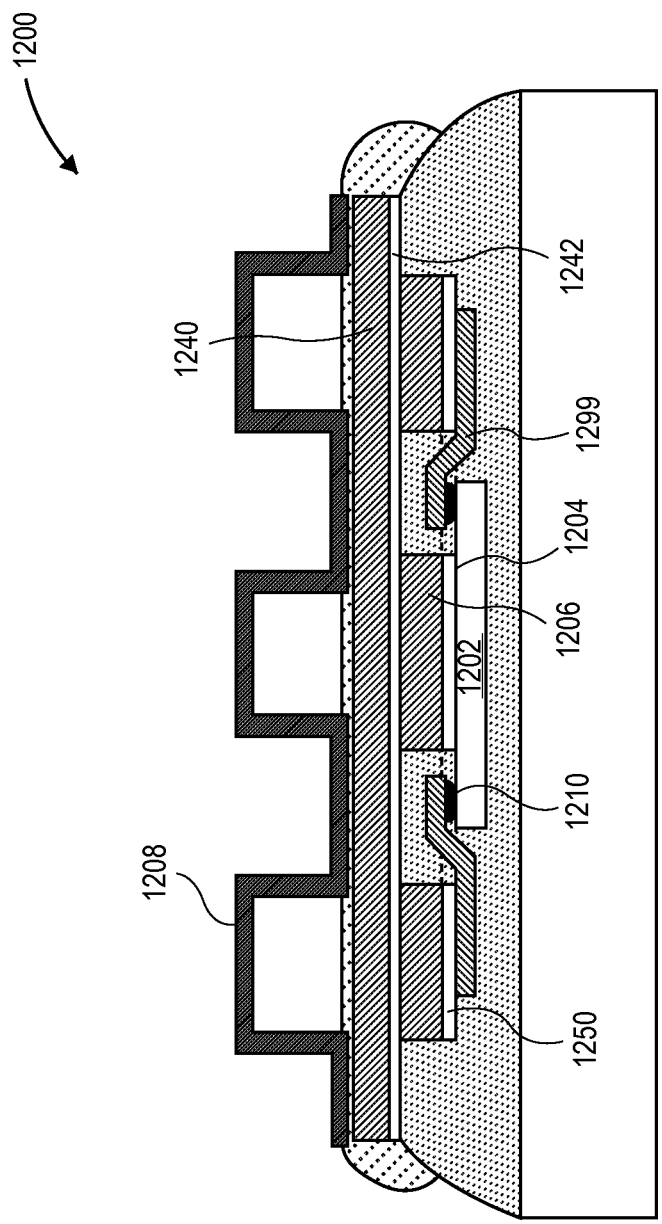
FIG. 12 illustrates a cross-section of an optoelectronic device with a heat spreader unit, in accordance with an embodiment of the present invention.

Referring to FIG. 12, an optoelectronic device 1200 includes a back-contact optoelectronic cell 1202. In accordance with an embodiment of the present invention, back-contact optoelectronic cell 1202 includes a plurality of back-contact metallization regions on the upper surface 1204 of optoelectronic cell 1202. Optoelectronic device 1200 also includes one or more heat spreader units 1206 disposed in a first layer above the plurality of back-contact metallization regions. In accordance with an embodiment of the present invention, the one or more heat spreader units 1206 is electrically isolated from the plurality of back-contact metallization regions, as depicted in FIG. 12. In one embodiment, a pair of cell interconnects 1299 is coupled with the plurality of back-contact metallization regions by one of a pair of bond pads 1210, as depicted in FIG. 12. In an embodiment, each of the pair of bond pads 1210 is coupled with the back-contact metallization regions by one of a pair of cell bus bars (not shown). In accordance with an embodiment of the present invention, optoelectronic device 1200 further includes an upper heat spreader unit 1240 disposed above the one or more heat spreader units 1206, and separated from the one or more heat spreader units by an upper dielectric layer 1242. In one embodiment, an optoelectronic system includes a plurality of back-contact optoelectronic cells, each back-contact optoelectronic cell further including an upper heat spreader unit, such as upper heat spreader unit 1240, disposed above one or more heat spreader units, and separated from the one or more heat spreader units by an upper dielectric layer, such as upper dielectric layer 1242. In an embodiment, optoelectronic device 1200 also includes a cell dielectric layer 1250. In an embodiment, optoelectronic device 1200 also includes a heat sink 1208 disposed above upper heat spreader unit 1240, as depicted in FIG. 12.

Figure 13:
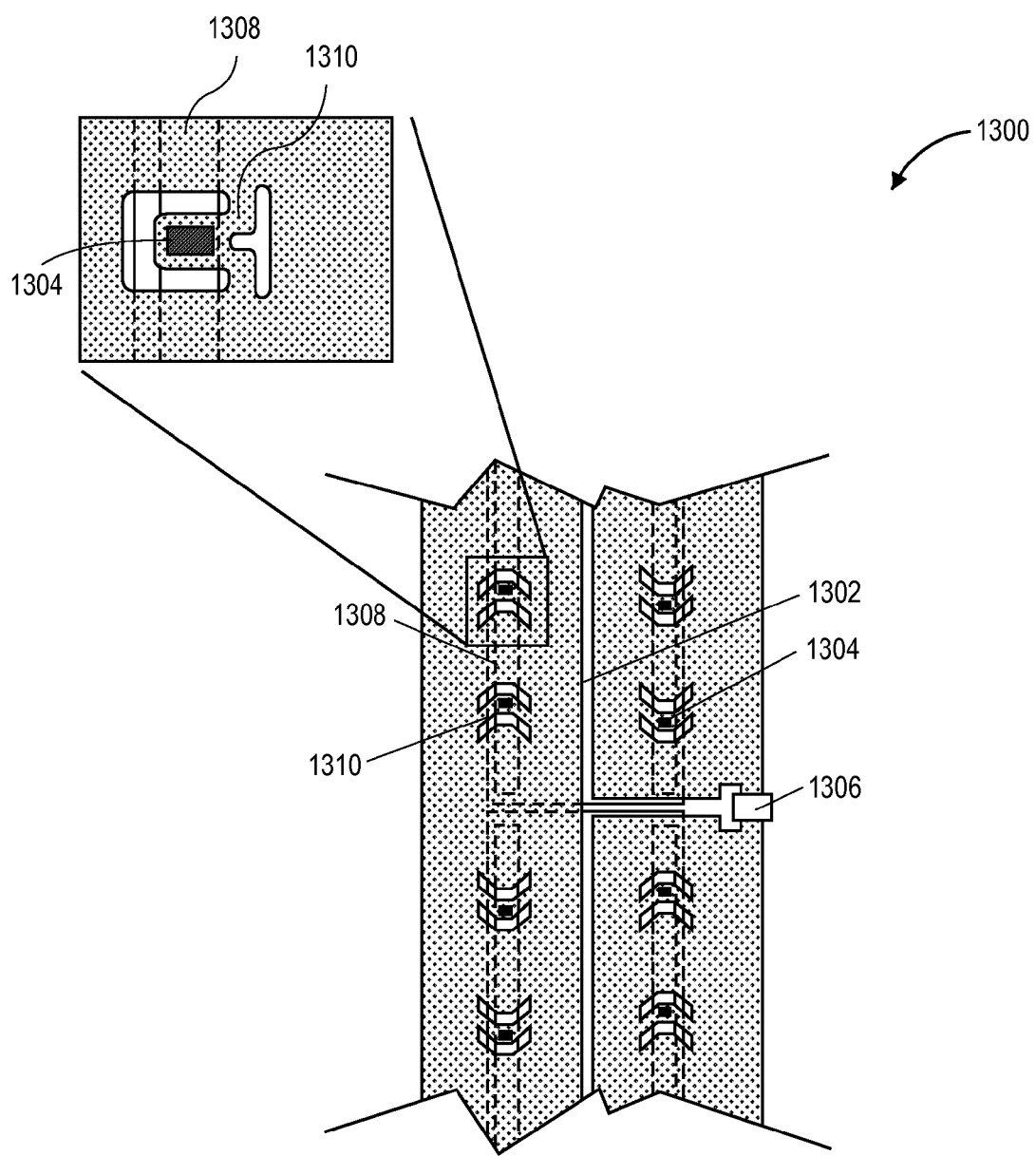
FIG. 13 illustrates a top-down view of a stress relief feature, in accordance with an embodiment of the present invention.

It is to be understood that the discussion of stress relief features herein is not limited to the features depicted and described above. As another example, FIG. 13 illustrates a top-down view of a stress relief feature, in accordance with an embodiment of the present invention. Referring to FIG. 13, an optoelectronic system 1300 includes one or more photovoltaic cells 1302, a cell bond pad 1304, a bypass diode 1306, a cell bus bar 1308, and a stress relief feature 1310 which is also magnified in FIG. 13.

Thus, optoelectronic devices with heat spreader units have been disclosed. In accordance with an embodiment of the present invention, an optoelectronic device includes a back-contact optoelectronic cell including a plurality of back-contact metallization regions. The optoelectronic device also includes one or more heat spreader units disposed above the plurality of back-contact metallization regions. The optoelectronic device also includes a heat sink disposed above the one or more heat spreader units. In one embodiment, the one or more heat spreader units includes a pair of cell interconnects, each of the pair of cell interconnects coupled with the plurality of back-contact metallization regions by one of a pair of bond pads. In another embodiment, the one or more heat spreader units is electrically isolated from the plurality of back-contact metallization regions.

What is claimed is:

1. A solar module, comprising: a solar cell having an upper surface; a heat spreader layer disposed directly above the upper surface of the solar cell and thermally coupled with the upper surface of the solar cell; and a cell interconnect disposed directly above the upper surface solar cell, the cell interconnect comprising an exposed portion in electrical contact with the upper surface of the solar cell, wherein, from a top-down perspective, the heat spreader layer completely surrounds an exposed portion of the cell interconnect which is exposed through the heat spreader layer.

2. The solar module of claim 1, wherein the exposed portion of the cell interconnect comprises a portion of a tab of the cell interconnect.

3. The solar module of claim 1, wherein the exposed portion of the cell interconnect comprises a tab of the cell interconnect.

4. The solar module of claim 1, wherein the solar cell comprises a plurality of contact metallization regions on the upper surface of the solar cell proximate to the heat spreader layer, and wherein the heat spreader layer is electrically isolated from the plurality of contact metallization regions.

5. The solar module of claim 1, wherein the solar cell comprises an inner portion and a pair of outer portions, and wherein the heat spreader layer is disposed above and over only the inner portion.

6. The solar module of claim 1, wherein the solar cell comprises an inner portion and a pair of outer portions, and wherein the heat spreader layer is disposed above and over both the inner portion and the outer portions.

7. The solar module of claim 1, wherein a portion of the heat spreader layer that at least partially surrounds the exposed portion of the cell interconnect is a stress-relief feature.

8. The solar module of claim 1, wherein the solar cell is a back-contact solar cell.

9. A solar module, comprising: a plurality of solar cells having upper surfaces; a heat spreader layer disposed directly above the upper surfaces of the plurality of solar cells and thermally coupled with the upper surfaces of the plurality of solar cells; and a plurality of cell interconnects electrically coupled with the upper surfaces of the solar cells coupling solar cells, wherein, from a top-down perspective, the heat spreader layer completely surrounds exposed portions of one or more of the cell interconnects which are exposed through the heat spreader layer.

10. The solar module of claim 9, wherein the exposed portions of the one or more cell interconnects comprises a portion of a tab of the one or more cell interconnects.

11. The solar module of claim 9, wherein the exposed portions of the one or more cell interconnects each comprises a tab of the one or more cell interconnects.

12. The solar module of claim 9, wherein each of the solar cells comprises a plurality of contact metallization regions on a surface of the solar cell proximate to the heat spreader layer, and wherein the heat spreader layer is electrically isolated from the plurality of contact metallization regions.

13. The solar module of claim 9, wherein each of the solar cells comprises an inner portion and a pair of outer portions, and wherein the heat spreader layer is disposed above and over only the inner portion.

14. The solar module of claim 9, wherein each of the solar cells comprises an inner portion and a pair of outer portions, and wherein the heat spreader layer is disposed above and over both the inner portion and the outer portions.

15. The solar module of claim 9, wherein portions of the heat spreader layer that at least partially surround the exposed portions of the one or more cell interconnects are stress-relief features.

16. The solar module of claim 9, wherein each of the solar cells is a back-contact solar cell.

17. The solar module of claim 1, wherein the heat spreader layer comprises a through hole, wherein the exposed portion of the cell interconnect is exposed through the through hole.

18. The solar module of claim 17, wherein the though hole is disposed directly above the exposed portion of the cell interconnect.

19. The solar module of claim 9, wherein the heat spreader layer comprises a plurality of through holes, wherein the exposed portions of the cell interconnects are exposed through the through holes.

20. The solar module of claim 19, wherein the though holes are disposed directly above respective exposed portions of the cell interconnects.

* * * * *